(12) United States Patent
Nazarian et al.

(10) Patent No.: US 9,385,319 B1
(45) Date of Patent: Jul. 5, 2016

(54) FILAMENTARY BASED NON-VOLATILE RESISTIVE MEMORY DEVICE AND METHOD

(71) Applicant: Crossbar, Inc., Santa Clara, CA (US)

(72) Inventors: Hagop Nazarian, San Jose, CA (US); Sung Hyun Jo, Sunnyvale, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/306,093

(22) Filed: Jun. 16, 2014

Related U.S. Application Data

(62) Division of application No. 13/466,008, filed on May 7, 2012, now Pat. No. 8,796,658.

(51) Int. Cl.
  *H01L 47/00* (2006.01)
  *H01L 45/00* (2006.01)
  *H01L 27/24* (2006.01)

(52) U.S. Cl.
  CPC ........ *H01L 45/1641* (2013.01); *H01L 27/2481* (2013.01); *H01L 45/12* (2013.01); *H01L 45/1246* (2013.01); *H01L 45/165* (2013.01)

(58) Field of Classification Search
  CPC ............ H01L 27/2481; H01L 45/1246; H01L 45/165; H01L 45/1641; H01L 45/12
  USPC ................ 438/960; 257/E27/004, 3
  See application file for complete search history.

(56) References Cited

U.S. PATENT DOCUMENTS

| | | | |
|---|---|---|---|
| 680,652 | A | 8/1901 | Elden |
| 4,433,468 | A | 2/1984 | Kawamata |
| 4,684,972 | A | 8/1987 | Owen et al. |
| 4,741,601 | A | 5/1988 | Saito |
| 5,139,911 | A | 8/1992 | Yagi et al. |
| 5,242,855 | A | 9/1993 | Oguro |
| 5,278,085 | A | 1/1994 | Maddox, III et al. |

(Continued)

FOREIGN PATENT DOCUMENTS

| | | |
|---|---|---|
| EP | 2 405 441 A1 | 1/2012 |
| EP | 2 408 035 A2 | 1/2012 |

(Continued)

OTHER PUBLICATIONS

Jian Hu et al., Area-Dependent Switching In Thin Film-Silicon Devices, Materials Research Society, Mal. Res. Soc. Symp Proc. vol. 762, 2003, pp. AI8.3.1-AI8.3.6.

(Continued)

*Primary Examiner* — David S Blum
(74) *Attorney, Agent, or Firm* — Amin, Turocy & Watson, LLP

(57) ABSTRACT

A resistive memory device includes a first metallic layer comprising a source of positive metallic ions, a switching media having an upper surface and a lower surface, wherein the upper surface is adjacent to the first metallic layer, wherein the switching media comprises conductive filaments comprising positive metallic ions from the source of positive metallic ions formed from the upper surface towards the lower surface, a semiconductor substrate, a second metallic layer disposed above the semiconductor substrate, a non-metallic conductive layer disposed above the second metallic layer, and an interface region between the non-metallic conductive layer and the switching media having a negative ionic charge.

20 Claims, 10 Drawing Sheets

(56) References Cited

U.S. PATENT DOCUMENTS

| | | |
|---|---|---|
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,645,628 A | 7/1997 | Endo et al. |
| 5,707,487 A | 1/1998 | Hori et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,858,468 B2 | 12/2010 | Liu et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumer et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,265,136 B2 | 9/2012 | Hong et al. |
| 8,274,812 B2 | 9/2012 | Nazarian et al. |
| 8,315,079 B2 | 11/2012 | Kuo et al. |
| 8,320,160 B2 | 11/2012 | Nazarian |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,467,227 B1 | 6/2013 | Jo |
| 8,587,989 B2 | 11/2013 | Manning et al. |
| 8,658,476 B1 | 2/2014 | Sun et al. |
| 8,659,003 B2 | 2/2014 | Herner et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |

(56) References Cited

U.S. PATENT DOCUMENTS

| | | |
|---|---|---|
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | DeLucca et al. |
| 2012/0043518 A1 | 2/2012 | Cheng et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0074374 A1 | 3/2012 | Jo |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0250183 A1 | 10/2012 | Tamaoka et al. |
| 2012/0269275 A1 | 10/2012 | Hannuksela |
| 2012/0305874 A1 | 12/2012 | Herner |
| 2012/0326265 A1 | 12/2012 | Lai et al. |
| 2013/0020548 A1 | 1/2013 | Clark et al. |

FOREIGN PATENT DOCUMENTS

| | | | |
|---|---|---|---|
| JP | 2005-506703 | A | 3/2005 |
| JP | 2006-032951 | A | 2/2006 |
| JP | 2007-067408 | A | 3/2007 |
| JP | 2007-281208 | A | 10/2007 |
| JP | 2007-328857 | A | 12/2007 |
| KR | 10-2011-0014248 | A | 2/2011 |
| WO | WO 03/034498 | A1 | 4/2003 |
| WO | WO 2009/005699 | A1 | 1/2009 |

OTHER PUBLICATIONS

Andre Dehon, Array-Based Architecture for FET-Based, Nanoscale Electronics, IEEE Transactions on nanotechnology, vol. 2, No. 1, Mar. 2003, pp. 23-32.

Herb Goronkin et al., High-Performance Emerging Solid-State Memory Technologies, MRS Bulletin, Nov. 2004, www.mrs.org/publications/bulletin, pp. 805-813.

Gerhard Muller et al., Status and Outlook of Emerging Nonvolatile Memory Technologies, IEEE, 2004, pp. 567-570.

A.E. Owen et al., Memory Switching in Amorphous Silicon Devices, Journal of Non-Crystalline Solids 59 & 60 (1983), pp. 1273-1280.

J. Campbell Scott, Is There an Immortal Memory?, www.sciencemag.org, vol. 304, Apr. 2, 2004, pp. 62-63.

S.H. Lee et al., Full Integration and Cell Characteristics for 64Mb Nonvolatile PRAM, 2004 Symposium on VLSI Technology Digest of Technical Papers, 2004 IEEE, pp. 20-21.

Stephen Y. Chou et al., Imprint Lithography With 25-Nanometer Resolution, Science, vol. 272, Apr. 5, 1996, pp. 85-87.

S. Zankovych et al., Nanoimprint Lithography: Challenges and Prospects, Institute of Physics Publishing, Nanotechnology 12, 2001, pp. 91-95.

A. Avila et al., Switching in Coplanar Amorphous Hydrogenated Silicon Devices, Solid-State Electronics 44, 2000, pp. 17-27.

Jian Hu et al., Switching and Filament Formation in Hot-Wire CVD P-Type A-Si:H Devices, Science Direct, Thin Solid Films 430, www.sciencedirecl.com, 2003, pp. 249-252.

S. Hudgens et al.. Overview of Phase-Change Chalcogenide Nonvolatile Memory Technology, MRS Bulletin, Nov. 2004, www.mrs.org/publications/bulletin, pp. 829-832.

K. Terabe et al., Quantized Conductance Atomic Switch, Nature, vol. 433, Jan. 6, 2005, www.nature.com/ nature, pp. 47-50.

Michael Kund et al., Conductive Bridging RAM (CBRAM): An Emerging Non-Volatile Memory Technology Scalable To Sub 20nm, IEEE, 2005.

W. Den Boer, Threshold Switching in Hydrogenated Amorphous Silicon, American Institute of Physics, 1982, pp. 812-813.

(56) References Cited

OTHER PUBLICATIONS

P.G. Lecomber et al., The Switching Mechnism in Amorphous Silicon Junctions, Journal of Non-Crystalline Solids 77 & 78,1985, North-Holland, Amsterdam, pp. 1373-1382.
A. E. Owen et al., Switching in Amorphous Devices, In!. J. Electronics, 1992, Vo. 73, No. 5, pp. 897-906.
M. Jafar et al., Switching in Amorphous-Silicon Devices, The American Physical Society, vol. 49, No. 19, 1994, pp. 611-615.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3 <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
*Ex parte Quayle* Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs. acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.

Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p$^+$a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.

(56) References Cited

OTHER PUBLICATIONS

Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Notice of Allowance for U.S. Appl. No. 13/769,152, dated Oct. 8, 2013.
Notice of Allowance for U.S. Appl. No. 13/905,074 , dated Oct. 8, 2013.

Notice of Allowability for U.S. Appl. No. 13/452,657, dated Oct. 10, 2013.
Notice of Allowance for U.S. Appl. No. 13/174,264, dated Oct. 16, 2013.
Notice of Allowability for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.
Office Action for U.S. Appl. No. 14/072,657, dated Jun. 17, 2014.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Office Action for U.S. Appl. No. 12/913,719 dated Feb. 17, 2011.
Office Action for U.S. Appl. No. 12/913,719 dated Jul. 22, 2011.
Notice of Allowance for U.S. Appl. No. 12/913,719 dated Mar. 12, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the international Searching Authority for PCT/US2011/045124 filed on Jul. 22, 2011.
Peng-Heng Chang et al, "Aluminum spiking at contact windows in Al/Ti-W/Si", Appl. Phys. Lett., Jan. 25, 1988, pp. 272-274, vol. 52 No. 4, American Institute of Physics.
J. Del Alamo et al, "Operating limits of Al-alloyed high-low junction for BSF solar cells", Solid-State Electronics, 1981, pp. 415-420, vol. 24, Pergamon Press Ltd., Great Britain.
Hao-Chih Yuan et al, "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.

(56) References Cited

OTHER PUBLICATIONS

Office Action of U.S. Appl. No. 13/436,714 dated Dec. 7, 2012.
Office Action for U.S. Appl. No. 13/564,639, dated Mar. 19, 2013.
Suehle et al. "Temperature dependence of soft breakdown and wear-out in sub-3 nm $SiO_2$ films", 2000, IEEE $38^{th}$ Annual International Reliability Physics Symposium, 2000, pp. 33-34, San Jose, California.
Shin et al. "Effect of Native Oxide on Polycrystalline Silicon CMP", Journal of the Korean Physical Society, Mar. 2009, pp. 1077-1081, vol. 54, No. 3.
Office Action for U.S. Appl. No. 13/447,036 dated Jul. 9, 2013.
Office Action for U.S. Appl. No. 13/764,698 dated Jul. 11, 2013.
Office Action for U.S. Appl. No. 13/481,600 dated Sep. 20, 2013.
Final Office Action dated Feb. 6, 2014 for U.S. Appl. No. 13/434,567, 22 pages.
Office Action dated Apr. 17, 2015 for U.S. Appl. No. 13/733,843, 49 pages.

FILAMENTARY BASED NON-VOLATILE RESISTIVE MEMORY DEVICE AND METHOD

This application claims priority to and is a divisional of U.S. application Ser. No. 13/466,008 filed on May 7, 2012, which is hereby incorporated by reference for all purposes.

BACKGROUND

The present invention is related to memory devices. More particularly, the present invention discloses non-volatile resistive switch memory devices having improved operational characteristics, fabrication techniques, as well as apparatus including such memories.

The inventors of the present invention have recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventors of the present invention recognize that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably requires high power consumption.

From the above, improved semiconductor memory devices that can scale to smaller dimensions with reduced drawbacks are therefore desirable.

SUMMARY

The present invention is related to memory devices. More particularly, embodiments according to the present invention disclose memory (e.g. switching) devices having improved data retention characteristics and methods for forming such devices. Embodiments are described with respect to non-volatile memory devices; however, embodiments may also be applied to a broader range of memory devices, processing devices, and the like.

Various embodiments of the present invention include the formation and use of a highly doped intermediate region between an undoped amorphous silicon layer (switching layer) and a doped polysilicon or doped silicon germanium layer. In various embodiments, the doped polysilicon or doped silicon germanium (SiGe) layer is disposed on top of a metal layer, and one or more metal layers (e.g. silver and aluminum) are disposed on top of the undoped amorphous silicon (a-Si) layer.

In various embodiments, the materials described above form a basic switching device: Top metal, Ag (filament metal), amorphous Si, doped intermediate material, doped polysilicon or SiGe, Bottom metal. In other embodiments, any number of additional layers may be used in such a device, for example, to promote adhesion, or the like. In various embodiments, the basic switching device may be formed as a back-end process for a CMOS device (e.g. stacked upon other CMOS devices).

In some embodiments, the dopant concentration of the highly doped intermediate region may be on the order of two or more magnitudes higher than the dopant concentration of the doped poly/SiGe. Additionally, these layers may be doped using the same type dopant (e.g. p+, Boron, etc.). In various embodiments, the intermediate region may be on the order of about 100 angstroms, or less. In some embodiments, when the highly doped intermediate region is placed in contact with the lower doped poly/SiGe, dopant impurities from the highly doped region typically migrate to the lower doped region. The migration of holes from the intermediate region, in various embodiments, result in the intermediate region having a negative charge.

In various embodiments, to cause the switching device to switch, a positive voltage is applied across the Top metal and Bottom metal causing an electrical field to form across the amorphous silicon. In response to the electrical field, positive metal (e.g. silver) ions from the silver metal migrate into the amorphous silicon. If enough silver ions migrate into the a-Si, a silver "filament" is formed, similar to a short-circuit through the a-Si. Accordingly, a measured resistance between the top and bottom metal will measurably drop, and the resistive memory device would have switched from a high resistance state to a lower resistance state.

In various embodiments, because the intermediate region becomes negatively charged, the silver ions (positive) in the amorphous silicon are attracted to the negatively charged region. Accordingly, the metallic (Ag) filament will be maintained through the amorphous silicon layer. The inventors of the present invention believe that this attraction mechanism will increase the longevity of the metallic filament, and thus will increase the retention time of the resistive memory device.

According to one aspect of the present invention, a resistive memory device is described. One device includes a first metallic layer comprising a source of positive metallic ions, and a switching media having an upper surface and a lower surface, wherein the upper surface is adjacent to the first metallic layer, wherein the switching media comprises conductive filaments comprising positive metallic ions from the source of positive metallic ions formed from the upper surface towards the lower surface. A device may include a semiconductor substrate, and a second metallic layer disposed above the semiconductor substrate. Various devices may include a non-metallic conductive layer disposed above the second metallic layer, and an interface region between the non-metallic conductive layer and the switching media having a negative ionic charge.

According to another aspect of the present invention, a method for forming a resistive memory device is described. One technique include disposing a first metallic layer above a semiconductor substrate, disposing a non-metallic conductive layer above the first metallic layer, and forming an interface region above and adjacent to the non-metallic conductive layer having a negative ionic charge. A process may include disposing a switching media above and adjacent to the interface region, where the switching media includes an upper surface and a lower surface, and disposing a second metallic layer comprising a source of positive metallic ions above and adjacent to the switching media.

According to yet another aspect of the present invention, a resistive memory device manufactured according to the following process is described. The process may include disposing a first metallic layer above a semiconductor substrate (e.g. disposing the first metallic layer on an insulating layer that is on top of a semiconductor substrate), disposing a non-metallic conductive layer above the first metallic layer, and forming an interface region above and adjacent to the non-metallic conductive layer having a negative ionic charge, disposing a switching media above and adjacent to the interface region, where the switching media includes an upper surface and a lower surface, and disposing a second metallic layer comprising a source of positive metallic ions above and adjacent to the switching media.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION

The present invention is generally related to a memory (switching) device and an apparatus including a memory device. More particularly, embodiments of the present invention provide structures and a method for forming one or more resistive switching devices each having improved memory retention characteristics. The embodiments described herein are described with respect to fabrication of high density non-volatile memory devices. However, one of ordinary skill in the art will recognize that these devices may be applied to a broad range of applications, such as processing devices, computing devices, or the like.

Figure 1:
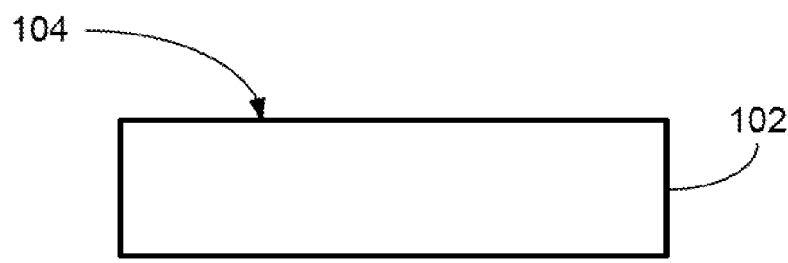
FIG. 1 illustrates a cross-section of a process step for forming a switching device according to various embodiments of the present invention.

FIG. 1 illustrates a substrate 102 having a surface region 104. In various embodiments, the substrate 102 can be a semiconductor substrate, such as: a single crystal silicon wafer, a silicon germanium wafer, a silicon-on-insulator substrate, commonly known as SOI, and the like. Depending on the specific embodiment, the processes described herein are back-end CMOS processes, i.e. processes limited to certain temperature ranges, and the like, that can be performed upon substrates having existing CMOS devices. Accordingly, the substrate 102 may include one or more transistor devices, conductors, or the like, formed therein (not shown). In various embodiments, the one or more devices may be operationally coupled to the switching device, e.g. a driver; may include processing or other computational logic; may include one or more physical sensors; or the like.

Figure 2:
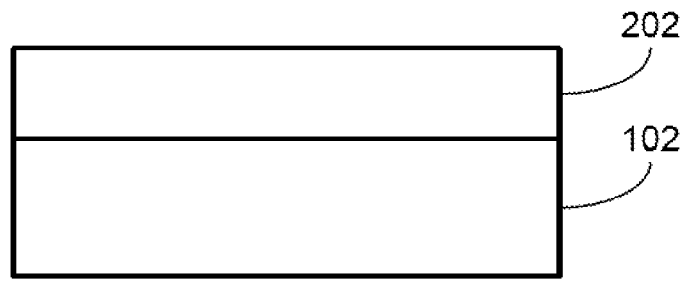
FIG. 2 illustrates a cross-section of a process step for forming a switching device according to various embodiments of the present invention.

FIG. 2 illustrates a resulting cross-section after a first dielectric material 202 is disposed overlying the surface region 104 of the semiconductor substrate 102. The first dielectric material can be a suitable dielectric material such as silicon oxide, silicon nitride or combinations thereof depending on the embodiment. The first dielectric material can be deposited using techniques such as chemical vapor deposition (CVD) process including plasma enhanced chemical vapor deposition or low pressure chemical vapor deposition depending on the application. For example, silicon oxide may be formed using silane, disilane, a suitable chlorosilane or TEOS and other suitable silicon bearing materials, depending on the embodiment.

Figure 3:
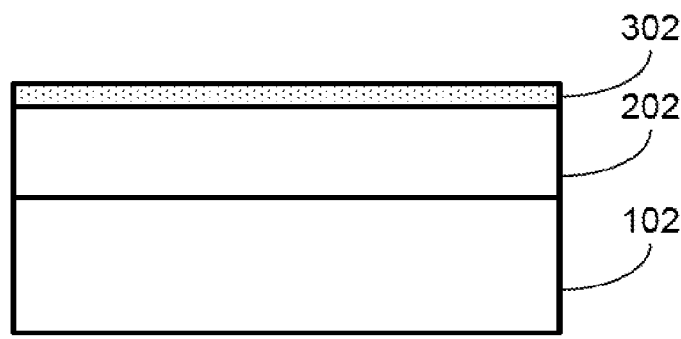
FIG. 3 illustrates a cross-section of a process step for forming a switching device according to various embodiments of the present invention.

FIG. 3 illustrates a first adhesion layer 302 may be formed overlying the first dielectric material. The first adhesion layer can be titanium, titanium nitride, tantalum, tantalum nitride, tungsten, or tungsten nitride or a combination of these. The first adhesion layer 302 may be deposited using a physical vapor deposition process such as a sputtering process in a specific embodiment. Techniques such as a chemical vapor deposition using a suitable precursor may also be used. For example, adhesion layer 302 may be formed by first depositing a titanium metal on the first dielectric material, following by sputtering a titanium nitride material.

Figure 4:
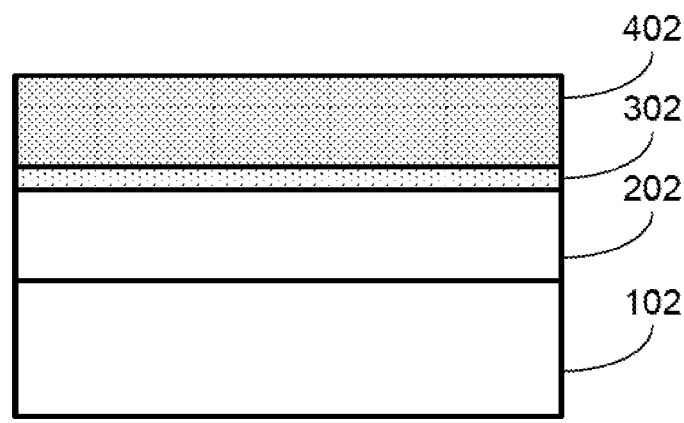
FIG. 4 illustrates a cross-section of a process step for forming a switching device according to various embodiments of the present invention.

Referring to FIG. 4, some embodiments include a first wiring material 402 formed overlying the first adhesion layer 302. The first wiring material 402 can be tungsten, copper, aluminum or other suitable metal materials including alloys thereof. In various embodiments, the first wiring material 402 can be deposited using techniques such as physical vapor deposition, evaporation, chemical vapor deposition, electrochemical methods such as electroplating or electrode-less deposition from a liquid medium, or other suitable deposition techniques including a combination. In certain embodiments, the first wiring material 402 can be a doped semiconductor material such as a doped silicon material. In a specific embodiment, the first adhesion layer 302 functions as a glue layer between the first wiring material 402 and the first dielectric layer 202. In a specific embodiment, tungsten is formed by sputtering on top of layer 302 to form layer 402. In various embodiments, the tungsten may have a thickness of between 100 nm and 1000 nm thick, and sometimes between 200 nm and 500 nm thick.

Figure 5:
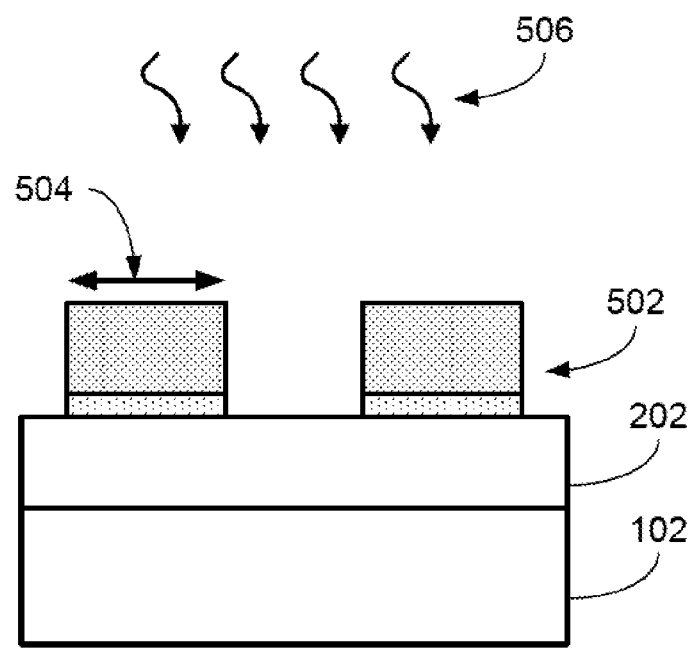
FIG. 5 illustrates a cross-section of a process step for forming a switching device according to various embodiments of the present invention.

The method performs a first pattern and etch process 506 to form a first (or bottom) wiring structure 502 as shown in FIG. 5. In some embodiments, the first wiring structure 502 includes the first wiring material 402 and the first adhesion material 302. As shown, the first wiring structure is characterized by a width 504, and extends in a first direction (e.g. into the page). In various embodiments, the first pattern and etch process includes forming a masking layer overlying the first wiring material 402 followed by an etching process 506. The masking layer can be an organic photo resist material, a hard mask, or the like depending on the application. In one example, where tungsten is the first wiring material 402, the first adhesion layer 302 can be titanium nitride, or a tungsten-bearing material; and the etching process can use a fluorine bearing species such as $CF_4$ etchant, or the like. In some embodiments, the first wiring structure 502 can have a width ranging from about 5 nm to about 1200 nm. In other embodiments, the width can range from about 30 nm to about 100 nm. Of course one skilled in the art would recognize other variations, modifications, and alternatives, depending upon desired feature size.

Figure 6:
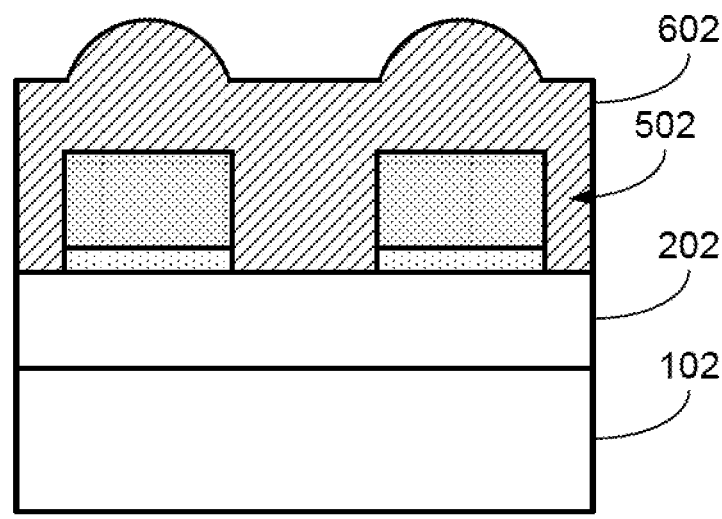
FIG. 6 illustrates a cross-section of a process step for forming a switching device according to various embodiments of the present invention.

In a specific embodiment, the method includes forming a second dielectric material 602 overlying the first wiring structure as illustrated in FIG. 6. The second dielectric material 602 can be silicon oxide, silicon nitride, or any suitable dielectric material including a dielectric stack and a combination of various dielectric materials depending on the embodiment. As merely an example, the second dielectric material can be a silicon oxide deposited using a plasma enhanced chemical vapor deposition (PECVD) process using tetra-ethyl oxy-silicate (TEOS) as precursor in a specific embodiment. Other deposition methods such as spin on glass followed by a suitable curing step may be used. Alternatively, a combination of more than one deposition processes may be used depending on the application.

Figure 7:
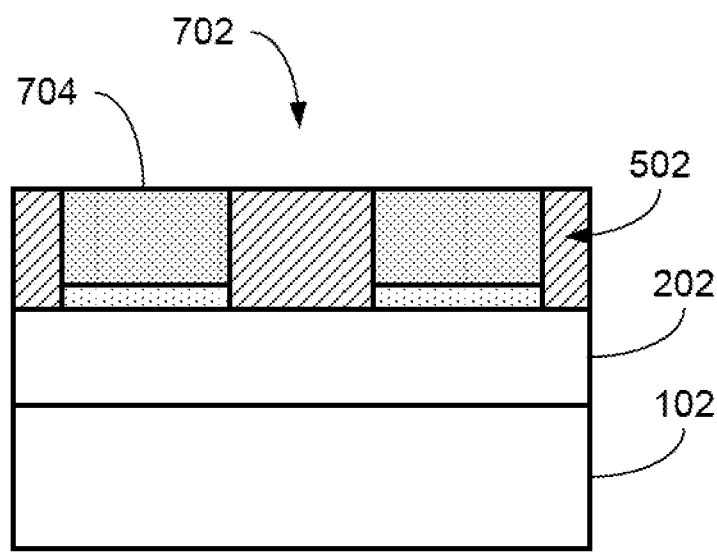
FIG. 7 illustrates a cross-section of a process step for forming a switching device according to various embodiments of the present invention.

Referring to FIG. 7, embodiments include performing a planarizing process to form a planarized second dielectric layer surface region 702 and expose a first wiring structure surface 704. In some embodiments, the planarizing process can be a chemical mechanical polishing (CMP) process using the first wiring (for example, tungsten) structure surface as a polishing stop in a specific embodiment. In other embodiments, the planarizing process can be a selective etch process such as a reactive ion etching using the first wiring (for example, tungsten) structure surface as an etch stop. In other embodiments a combination of chemical and physical processes may be performed to obtain the result illustrated in FIG. 7.

Figure 8:
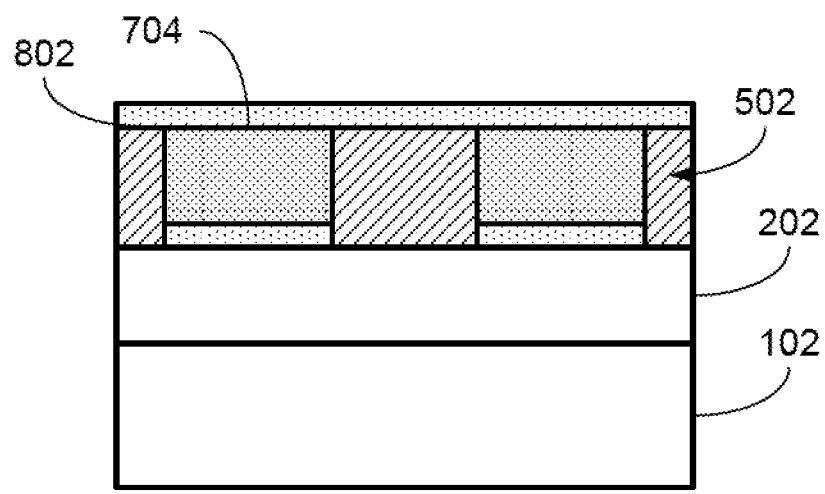
FIG. 8 illustrates a cross-section of a process step for forming a switching device according to various embodiments of the present invention.

In some embodiments of the present invention, the process includes deposition of a bottom metallic barrier material 802 overlying the first wiring structure surface 704 as shown in FIG. 8. In some embodiments, bottom metallic barrier material 802 can be titanium, titanium nitride, tantalum, tantalum nitride, or tungsten nitride or a combination of these. The bottom metallic barrier material 802 may be deposited using a physical vapor deposition process such as sputtering in a specific embodiment. In other embodiments, techniques such as a chemical vapor deposition using a suitable precursor may also be used.

Figure 9:
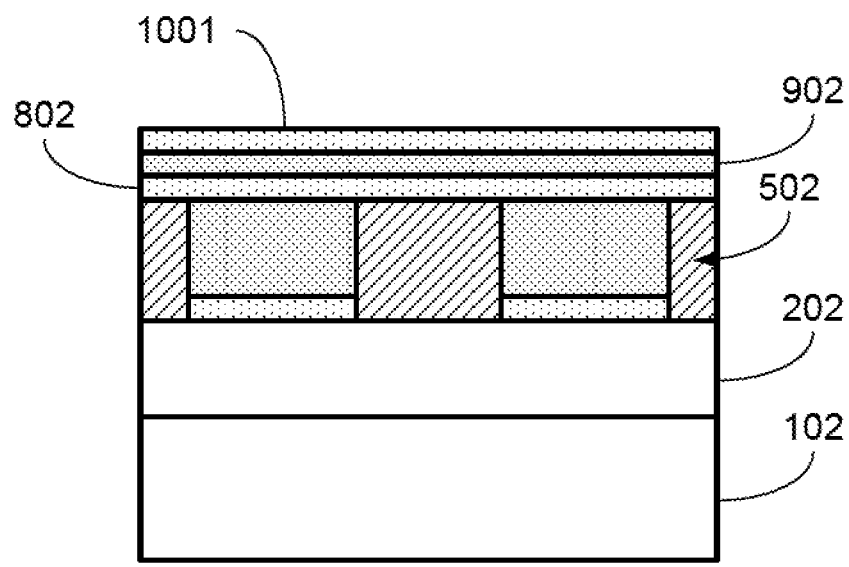
FIG. 9 illustrates a cross-section of a process step for forming a switching device according to various embodiments of the present invention.

As shown in FIG. 9, the method includes depositing a contact layer 902 overlying the bottom metallic barrier material 802. In certain embodiments, the contact layer 902 serves to control and improve switching capability for the switching device. For example for a switching device using amorphous silicon as the switching material (described below), the contact layer 902 can be a polysilicon material in a specific embodiment. In various embodiments, the polysilicon material may be doped with a p-type dopant, such as a boron bearing species, or the like. In some embodiments, the dopant concentration ranges from about $1E18$ per $cm^3$ to about $1E22$ per $cm^3$, and in other embodiments, the dopant concentration is on the order of about $1E19$ per $cm^3$. In some embodiments, the polysilicon material is formed using a plasma enhanced chemical vapor deposition process or a low pressure chemical vapor deposition process and a silicon bearing species such as silane, disilane, a suitable chlorosilane, and others. The impurity species may be doped, in-situ, or ex-situ depending in the embodiment. In various embodiments, deposition temperature ranges from about 300 Degree Celsius to about 550 Degree Celsius may be utilized.

In an alternative embodiment, the contact layer 902 may be a polycrystalline silicon germanium material. In such cases, the silicon germanium material may be doped with a p-type dopant, such as a boron bearing species, or the like. In some embodiments, the dopant concentration ranges from about $1E18$ per $cm^3$ to about $1E22$ per $cm^3$, and in other embodiments, the dopant concentration is on the order of about $1E19$ per $cm^3$. The polycrystalline silicon germanium material having the p+ impurity characteristic can be formed using a plasma enhanced chemical vapor deposition process, a low pressure chemical vapor deposition process, or others, using a suitable silicon precursor, a suitable germanium precursor, and a suitable p type impurity species. As examples, the silicon precursor can be silane, disilane, a suitable chlorosilane, and others; the germanium precursor can be germane ($GeH_4$), germanium chloride ($GeCl_4$), and other suitable germanium bearing species; and the p+ impurity can be provided using a boron bearing species, an aluminum bearing species, a gallium bearing species, an indium bearing species, and others. The impurity species may be doped, in-situ, or ex-situ, depending in the embodiment. In various embodiments, deposition temperature for the polycrystalline silicon germanium material can range from about 350 Degree Celsius to about 500 Degree Celsius. In such embodiments, the contact layer 902 will typically be polycrystalline in nature without an anneal step. In some embodiments, contact layer 902 may be formed using a technique disclosed in the above-referenced patent application.

As illustrated in FIG. 9, an interface layer 1001 may also be specifically formed over the contact layer 902. In various embodiments, interface layer 1001 may be similar to composition as the switching material 1002 (described below), such as an amorphous silicon material. In various embodiments, the switching material 1002 is not intentionally doped, whereas interface layer 1001 is intentionally doped. Further details regarding formation of the amorphous silicon material is provided below. In various embodiments, the interface layer 1001 is intentionally doped with a p-type dopant, similar to the p-type dopant used in the contact layer 902. For example, the p-type impurity may be include a boron bearing species, an aluminum bearing species, a gallium bearing species, an indium bearing species, and the like. In contrast to the contact layer 902, the interface layer 1001 has a substantially higher impurity concentration. In some examples, the contact layer 902 has an impurity concentration on the order of 1E19 per $cm^3$, and the interface layer 1001 has a p-type dopant concentration of 1E15 per $cm^3$ to about 5E22 per $cm^3$, or the like. In various embodiments, the doping may be performed in situ, or the like. In various embodiments, the interface layer 1001 may be on the order of about 100 Angstroms, or the like.

In other embodiments, the interface layer (interface region) 1001 may be formed as a part or region of the contact layer 902 deposition. In such embodiments, while the polycrystalline material (e.g. polysilicon, silicon germanium) is deposited as the contact layer 902, the in situ concentration of the dopant material may be modified. As an example, the concentration of Boron, or the like may be greatly increased near the end of the deposition of the contact layer 902 to form the interface layer 1001. Similar to the embodiments described above, it is contemplated that interface region 1001 may be on the order of about 100 Angstroms, or the like.

In various embodiments, based upon the differences in dopant concentrations of interface region 1001 (higher) and the contact layer 902 (lower), it is contemplated that the p+ dopants within the interface region 1001 will tend to migrate (e.g. out-diffuse) to regions of lower p concentration, i.e. the contact layer 902. In various embodiments, this migration of p+ dopants will tend to give the interface region 1001 a negative ionic charge. As will be described further below, it is believed that the negative ionic charge of the interface region 1001 will tend to attract positively charged metallic ions that may be present within the switching material 1002.

Figure 10:
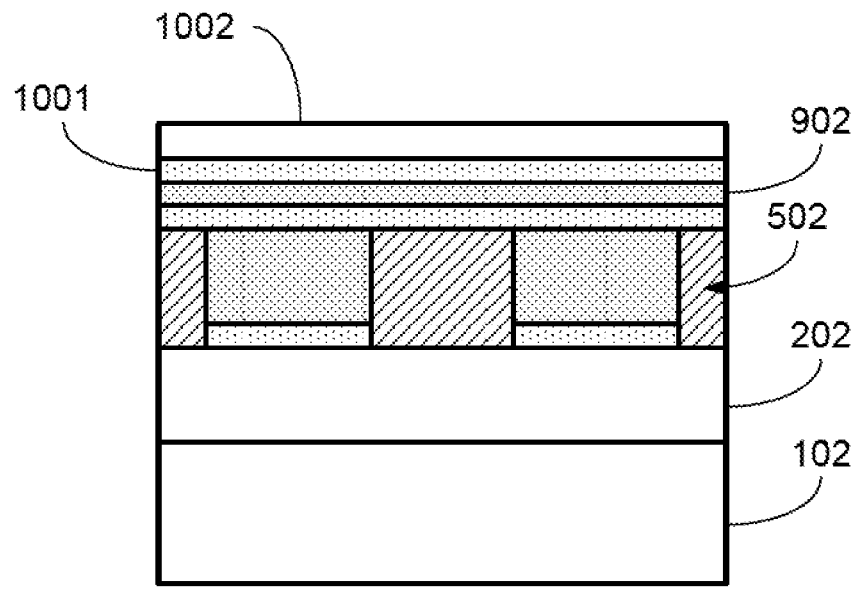
FIG. 10 illustrates a cross-section of a process step for forming a switching device according to various embodiments of the present invention.

As illustrated in FIG. 10, various processes include forming a switching material 1002 overlying the interface layer or region 1001. In various embodiments, the switching material 1002 can be an intrinsic amorphous silicon material, that is not intentionally doped. The intrinsic amorphous silicon material can be deposited using a chemical deposition method or a physical deposition method depending on the embodiment. The chemical deposition method can include a chemical vapor deposition process using silane, disilane, a suitable chlorosilane, or a suitable silicon-containing gas as a precursor. In a specific embodiment, the intrinsic amorphous silicon material may be deposited using a plasma-assisted chemical deposition method. In various embodiments, the deposition temperature for the amorphous silicon material can range from about 200 Degree Celsius to about 500 Degree Celsius and sometimes at about 350 Degree Celsius to about 400 Degree Celsius. Depending on the embodiment, the amorphous silicon material 1002 can be provided at a thickness ranging from about 5 nm to about 100 nm. In some embodiments, the amorphous silicon material 1002 is provided at a thickness ranging from about 10 nm to about 50 nm. Depending on the application, the amorphous silicon material 1002 may also be deposited using a physical vapor deposition such as sputtering using a suitable silicon target material.

In some embodiments, the interface layer 1001 may be formed as part or region of the switching material 1002 deposition. In such embodiments, initially while amorphous silicon material is being deposited, a high concentration of p+ dopants may be provided, in situ, to form interface layer 1001. After the interface layer 1001 of doped amorphous silicon material is formed, p+ dopants may be removed from the chamber, and undoped amorphous silicon material 1002 may be formed above the interface layer 1001.

Figure 11:
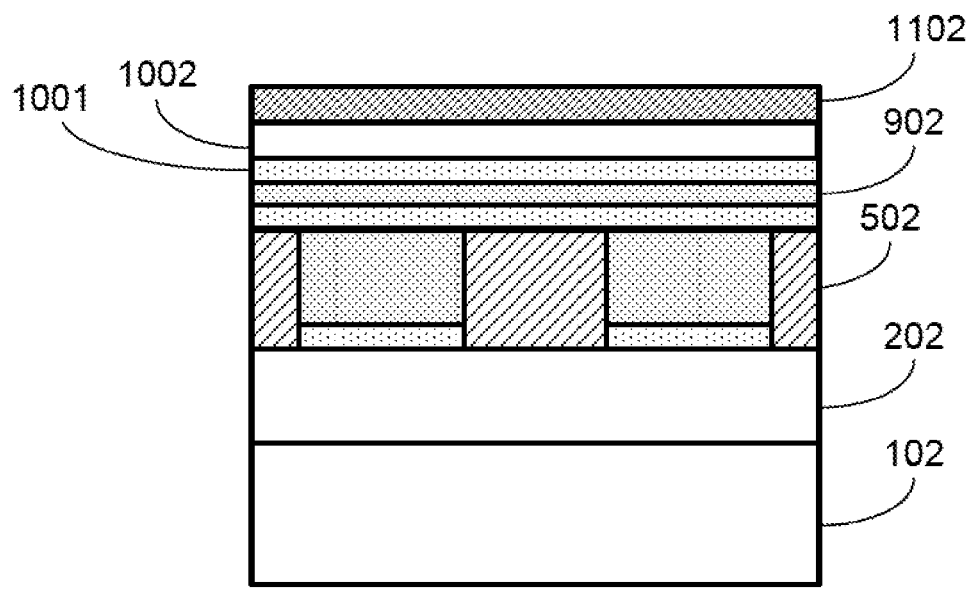
FIG. 11 illustrates a cross-section of a process step for forming a switching device according to various embodiments of the present invention.

As illustrated in FIG. 11, various embodiments include depositing a conductive material 1102 overlying switching material 1002. In a specific embodiment, for an amorphous silicon switching material, conductive material 1102 can comprise a silver material, and in other embodiments, materials including silver, platinum, palladium, copper or nickel, or a combination may be used for conductive material 1102. The conductive material 1102 can be deposited using a physical deposition process such as sputtering or evaporation. The silver material may also be formed using a chemical deposition process such as chemical vapor deposition, electrochemical such as electroplating, electrodeless deposition, or a combination depending on the application.

In some embodiments, a thin layer of material may be present prior to the deposition of conductive material 1102. This thin layer may be within the range of approximately 5 nm to approximately 25 Angstroms, approximately 40 A to 30 A, approximately 30 A, or the like. In some embodiments, the thin layer serves to reduce the diffusion or agglomeration of conductive material 1102 (e.g. silver) into switching material 1102 during fabrication of the disclosed structures. In such embodiments, as back end fabrication steps may include high temperature operations, the thin layer reduces the migration of the metallic ions into the switching material 1002. In some embodiments, the thin layer also serves to restrict or control where metallic ions migrate into switching material 1002 during operation of the device. In some embodiments, during operation of the device a thin oxide layer is used to control a conductive path from a metallic layer to the switching layer. In various embodiments of the present invention, the thin layer may be a layer of oxide, carbon, or other relative stable material. These materials may be formed via a plasma enhanced chemical vapor deposition process, an atomic layer deposition process, a spin coating process, a plasma oxidation process, a physical vapor deposition process, a naturally occurring growth, or the like. In some embodiments, the formed oxide may be etched until the desired thickness is obtained for the thin layer. In some examples, an Argon etch may be used. In some embodiments, the conductive material 1102 is thus formed or deposited on top of the thin layer that is specifically grown, formed, deposited, or naturally occurring upon the silicon switching material 1002.

Figure 12:
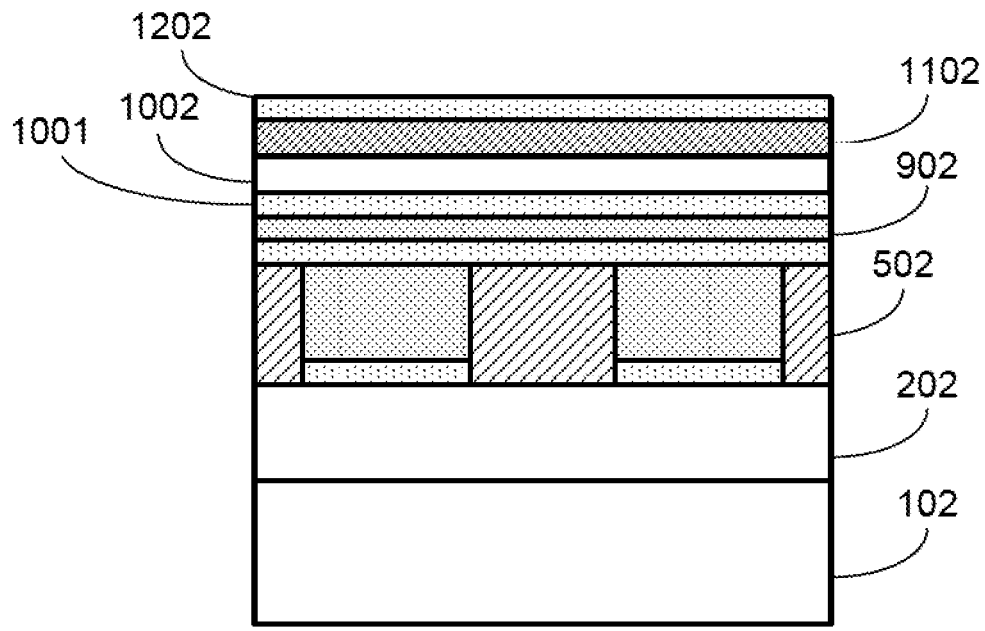
FIG. 12 illustrates a cross-section of a process step for forming a switching device according to various embodiments of the present invention.

The method deposits a top barrier material 1202 overlying the conductive material as shown in FIG. 12. Top barrier material 1202 layer can protect the conductive material 1102. Top barrier material 1202 can also serve as a diffusion barrier between conductive material 1102 and subsequent materials, and forms an electrical contact between conductive material 1102 and subsequent materials. Top barrier material 1202 can also serve as a polish stop material in a subsequent step for a CMP process. Top barrier material 1202 can be titanium, titanium nitride, tantalum or tantalum nitride, tungsten, or tungsten nitride, or any suitable barrier material depending on the embodiment. Depending on the application, top barrier material 1202 can be formed using a chemical deposition such as atomic layer deposition, chemical vapor deposition, and others, or a physical deposition such as sputtering, depending on the application.

Figure 13:
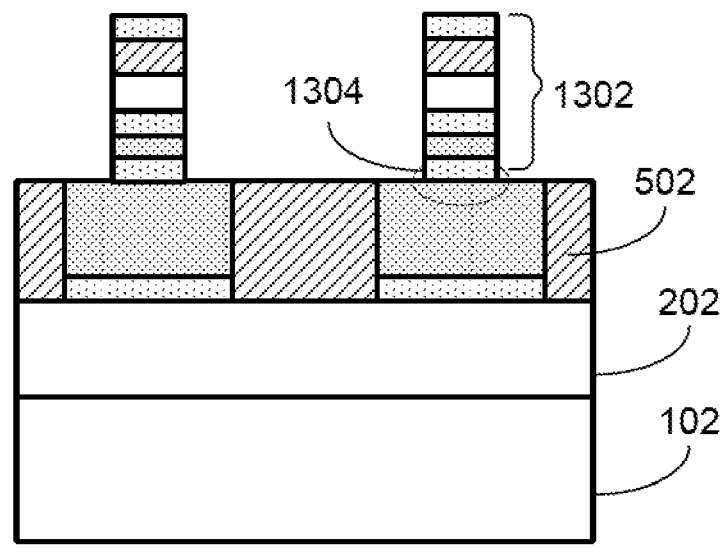
FIG. 13 illustrates a cross-section of a process step for forming a switching device according to various embodiments of the present invention.

In a specific embodiment, the method includes subjecting a stack of material comprising the bottom metallic barrier material 802, the contact material 902, the interface layer 1001, the switching material 1002, the conductive material 1102, and the top barrier material 1202 to a second pattern and etch process to form a plurality of pillar structures 1302 as shown in FIG. 13. The shape of the cross section shape of pillar structures 1302 may be approximately square, rectangular, circular, hexagonal, or other similar shape. Each of the pillar structure includes the bottom metallic barrier material 802, the contact material 902, the interface layer 1001, the switching material 1002, the conductive material 1102, and the top barrier material 1202.

As shown, in one embodiment, each of the pillar structure 1302 including the bottom metallic barrier material maintains a metal-to-metal contact 1304 with the first wiring structure 802. Depending on the embodiment, the pillar structure 1302 can be aligned to the bottom wiring structure 502 as shown in FIG. 13a. The pillar structure 1302 may not necessarily be perfectly aligned to the first wiring structure 502 as shown in FIG. 13b while maintaining the metal-to-metal contact in a specific embodiment.

Figure 14:
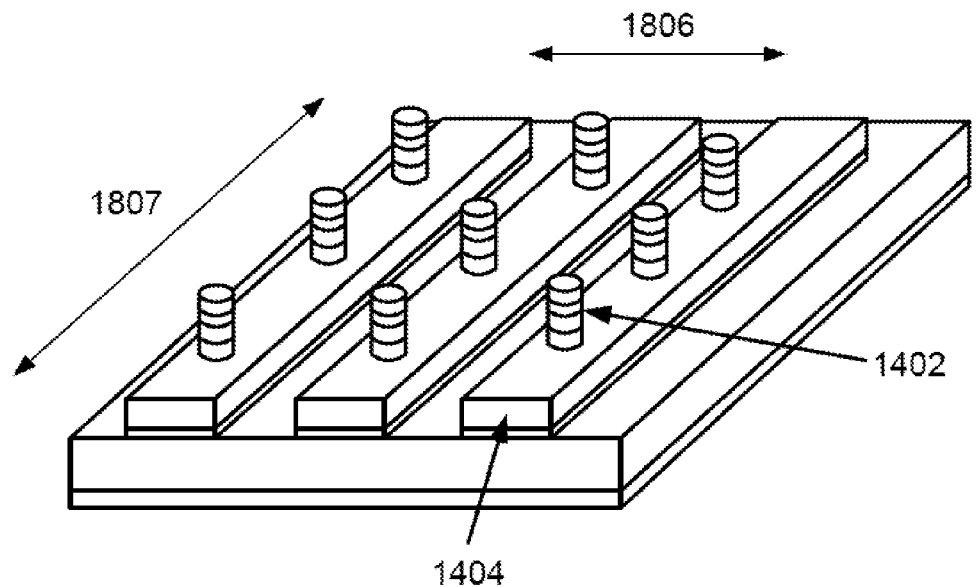
FIG. 14 illustrates a perspective view of a process step for forming a switching device according to various embodiments of the present invention.
Figure 15:
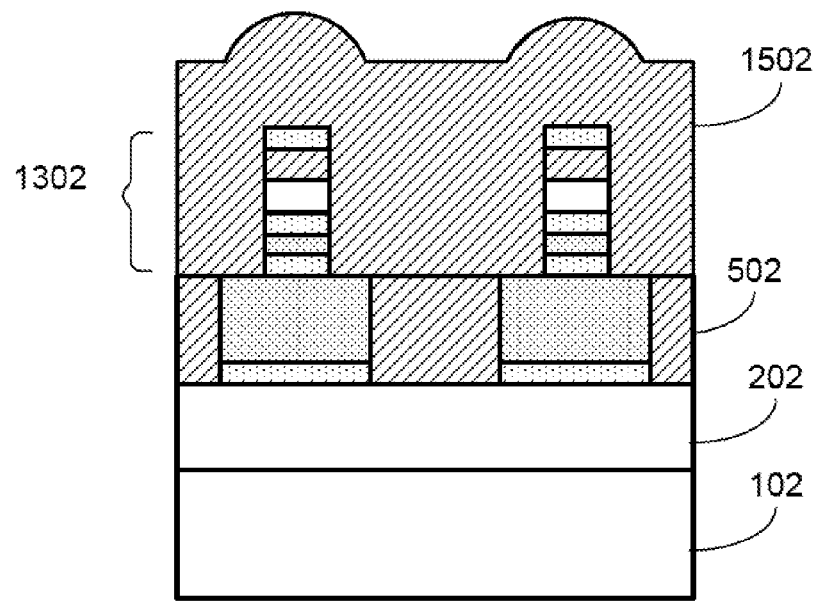
FIG. 15 illustrates a cross-section of a process step for forming a switching device according to various embodiments of the present invention.

In various embodiments, the pillar structure can have a feature size of less than about 250 nm and preferably about 90 nm, or even 40 nm, depending on the technology node adopted. The bottom wiring structure can have a width of about 90 nm or greater. The pillar structure with a bottom metallic barrier material enables a metal-to-metal contact with the first wiring structure even when there is a misalignment of the pillar structure to the first wiring structure during the second pattern and etch process in a specific embodiment. A perspective view of a plurality of pillar structures 1402 on the first wiring structure 1404 is illustrated in FIG. 14.

After forming the pillar structures 1302, the method includes depositing a third dielectric material 1502 overlying at least the plurality of pillar structures including exposed regions of the first wiring structures. The third dielectric material can be silicon oxide, silicon nitride, or suitable dielectric material including a dielectric stack with a combination of various dielectric materials depending on the embodiment. As merely an example, the third dielectric material can be a silicon oxide deposited using a plasma enhanced chemical vapor deposition (PECVD) process using tetraethyl oxy-silicate as precursor in a specific embodiment. Other deposition method such as spin on glass followed by a suitable curing step may be used. Alternatively, a combination of deposition processes may be used depending on the application.

Figure 16:
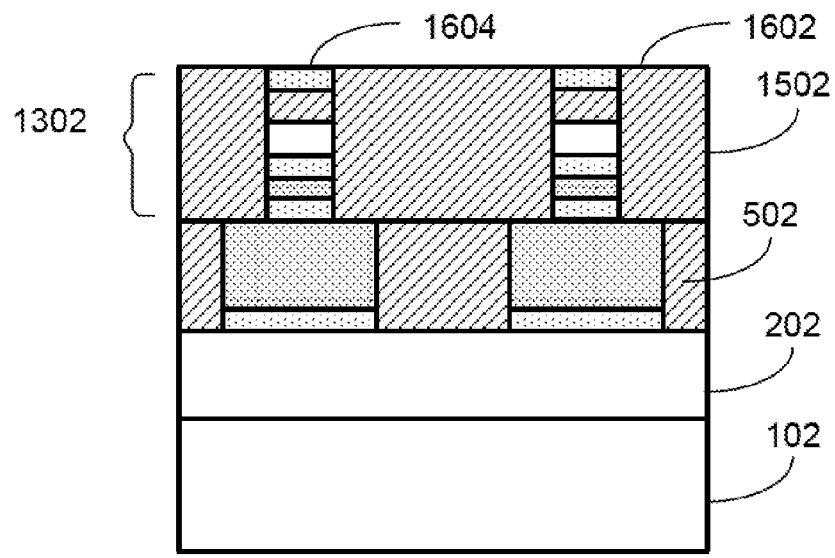
FIG. 16 illustrates a cross-section of a process step for forming a switching device according to various embodiments of the present invention.

In a specific embodiment, the third dielectric layer is subjected to a planarizing process to form a planarized third dielectric layer surface 1602 and exposing a top surface region 1604 of the pillar structure as shown in FIG. 16. The exposed top surface region of the pillar structure includes a surface region of the top barrier material in a specific embodiment. The planarizing process can be a chemical mechanical polishing (CMP) process using the top barrier material as a polishing stop in a specific embodiment. The planarizing process can be a selective etch process such as a reactive ion etching using the top barrier material surface as an etch stop in specific embodiment. Of course one skilled in the art would recognize other modifications, variations, and alternatives.

Figure 17:
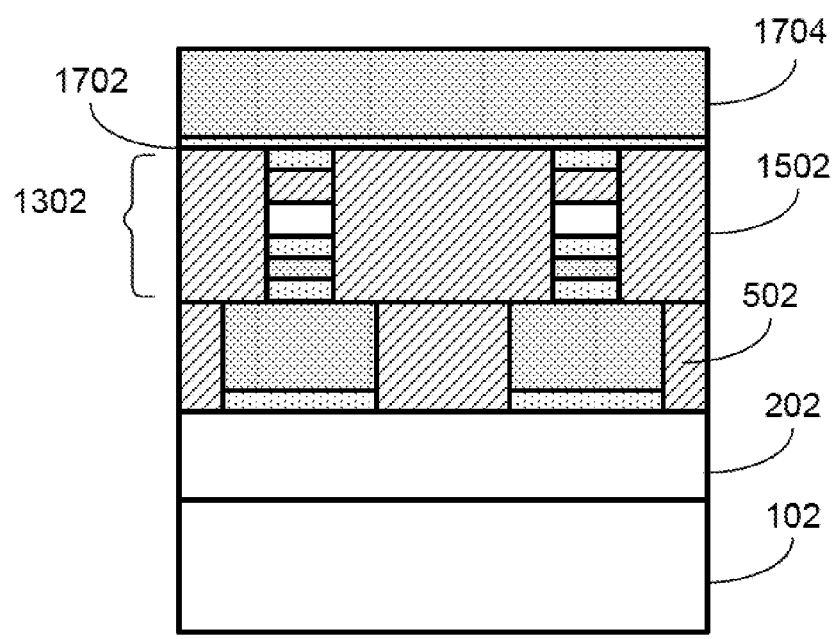
FIG. 17 illustrates a cross-section of a process step for forming a switching device according to various embodiments of the present invention.

Referring to FIG. 17. The method includes depositing a second adhesion material 1702 overlying the planarized third dielectric layer surface and the top surface region of the pillar structure. The second adhesion layer can be titanium, titanium nitride, tantalum, tantalum nitride, or tungsten nitride or a combination of these. The second adhesion material 1702 may be deposited using a physical vapor deposition process such as sputtering in a specific embodiment. Techniques such as a chemical vapor deposition including atomic layer deposition using a suitable precursor may also be used. In a specific embodiment, the method deposits a top wiring material 1704 overlying the second adhesion material 1702. The second wiring material 1702 can be tungsten, copper, aluminum or other suitable metal materials including alloys. The second wiring material 1702 can be deposited using techniques such as physical vapor deposition, evaporation, chemical vapor deposition, electrochemical methods such as electroplating or electrodeless deposition from a liquid medium, or other suitable deposition techniques including a combination. In certain embodiments, the top wiring material 1702 can be a doped semiconductor material such as a doped silicon material. In a specific embodiment, the second adhesion material 1702 functions as a glue layer between the top wiring material and the third dielectric layer. Taking tungsten as the second wiring material 1704 as an example, tungsten can have a thickness ranging from about 100 nm to about 1000 nm and preferably ranging from about 200 nm to about 500 nm depending on the application.

Figure 18:
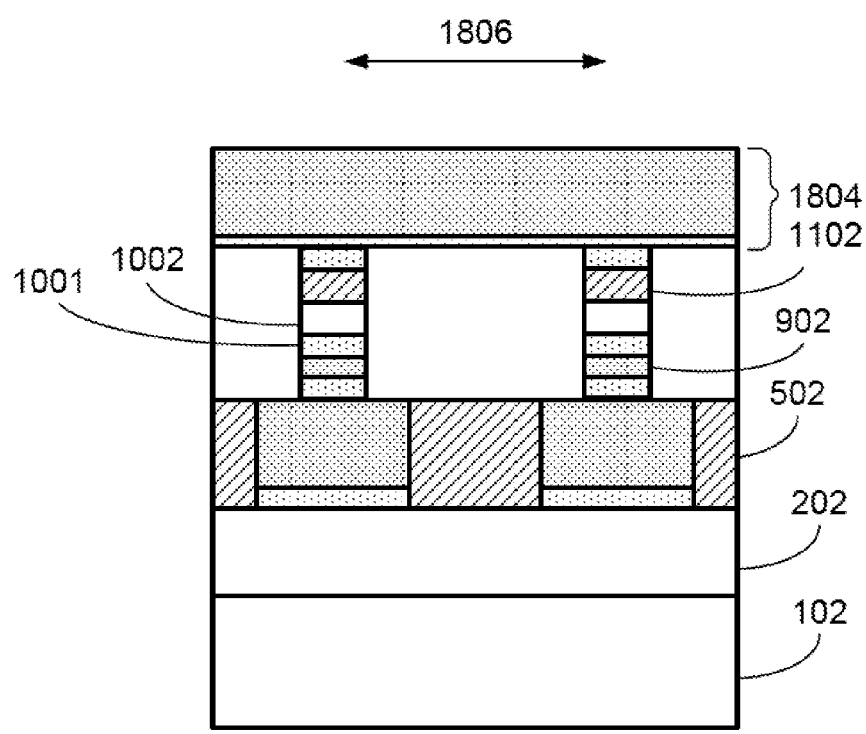
FIG. 18 illustrates a cross-section of a device structure of a switching device according to various embodiments of the present invention.

In various embodiments, the method performs a third pattern and etch process to form a top wiring structure 1804 as shown in FIG. 18. The top wiring structure 1804 includes the top wiring material 1704 and the second adhesion material 1702 in a specific embodiment. In a specific embodiment, the top wiring structure is formed in a direction 1806 (also FIG. 14) at an angle to the bottom wiring structure direction (1807, FIG. 14). In certain embodiments, the top wiring structure 1804 is formed orthogonal to the bottom wiring structure 502. Of course one skilled in the art would recognize other variations (e.g. angles), modifications, and alternatives.

Figure 19A:
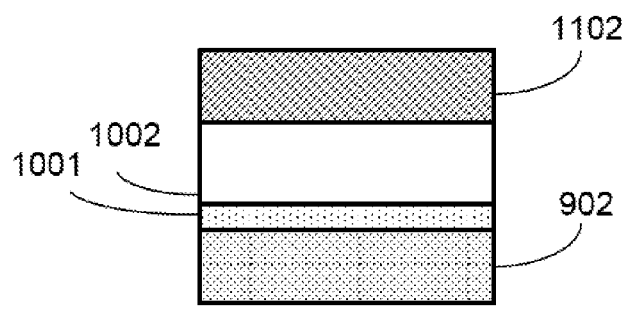
FIGS. 19A-D illustrate cross-sections of a device structure of a switching device according to various embodiments of the present invention.

FIGS. 19A-D illustrates operational diagrams according to various embodiments of the present invention. FIG. 19A illustrates a close-up view of an embodiment of the switching portion including contact layer 902 (e.g. p-doped polysilicon), interface region 1001 (e.g. p+ doped amorphous silicon), switching material 1020 (e.g. amorphous silicon), and conductive material 1102 (e.g. aluminum).

Figure 19B:
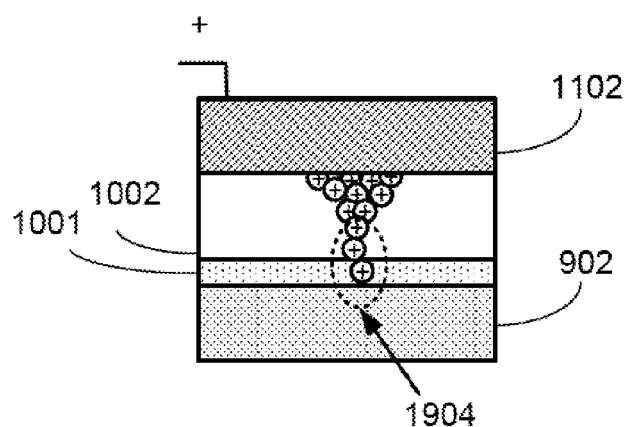

FIG. 19B illustrates an embodiment when a voltage, e.g. a forming voltage is applied across with switching portion. As illustrated, conductive metal particles (e.g. ions) of the conductive material 1102 migrate into switching material 1020 upon application of a positive voltage. When sufficient numbers of metal ions migrate within conductive material 1102, a filament-type structure 1904 is formed, as shown.

In various embodiments, the filament structure is characterized by a physical length. The length has been found to be dependent on an amplitude and polarity of a voltage applied across to the top wiring structure 1804 and the bottom wiring structure 502. Formation of this filament 1904 changes the resistance of the switching material 1102 in a specific embodiment. In some embodiments, the conductive material 1102 is silver and the switching material 1002 is amorphous silicon. Then, upon applying a positive voltage to the top wiring structure 1804 with respect to the bottom wiring structure 502, a plurality of silver particles migrate into regions of the amorphous silicon material. The plurality of silver particles can include a silver filament structure having a length. Subsequently, when a voltage (e.g. a read voltage less than the forming voltage) is applied across the switching portion, the silver filament conducts current through switching material 1002. Accordingly, the resistance of the resistive memory depends upon the length of the silver filament, in various embodiments. The length of the silver filament structure changes upon applying sufficiently high or low voltages (for example operating voltage such as write voltage or erase voltage), thus changing the resistance (e.g. reducing) of the amorphous silicon material 1002.

FIG. 19B illustrates an embodiment when a voltage, e.g. an erase voltage is applied across switching portion starting from the configuration illustrated in FIG. 19B. As illustrated, conductive metal particles (e.g. positive metallic ions) of the conductive material 1102 migrate away from contact layer 902 upon application of a negative voltage. When sufficient numbers of metal ions migrate away from contact layer 902, the filament-type structure 1904 is greatly reduced, as shown. In various embodiments, when a voltage (e.g. a read voltage greater than the erase voltage, but less than the forming voltage) is applied across the switching portion, the conduction of current through switching material 1002 is greatly reduced, i.e. the resistance is increased.

Figure 19C:
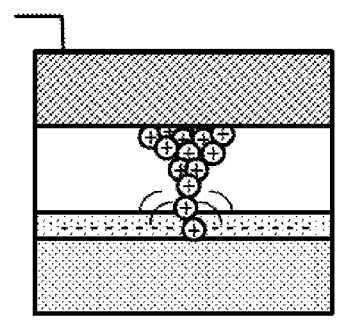

FIG. 19C illustrates an embodiment when no voltage (e.g. a read voltage, a forming voltage, an erase voltage, or the like) is applied across the switching portion starting from the configuration illustrated in FIG. 19B. As was mentioned above, interface layer 1001 can be a highly doped p material, e.g. amorphous silicon, and contact layer 902 can be a doped p material, e.g. polysilicon. As a result of the differences in doping concentrations, it is envisioned that holes will migrate from interface layer 1001 to contact layer 902. In various embodiments, the net result of the migration is that the interface layer 1001 becomes negatively charged, as shown.

In various embodiments, the conductive metallic particles are envisioned to be positive metallic ions. Within the configuration of FIG. 19C, the conductive metallic particles become attracted to the negatively biased interface layer 1001, as shown. Since, the positive metallic ions are attracted to the negatively biased interface layer 1001, the retention time of the resistive memory device described in the various embodiments is believed to be increased.

Figure 19D:
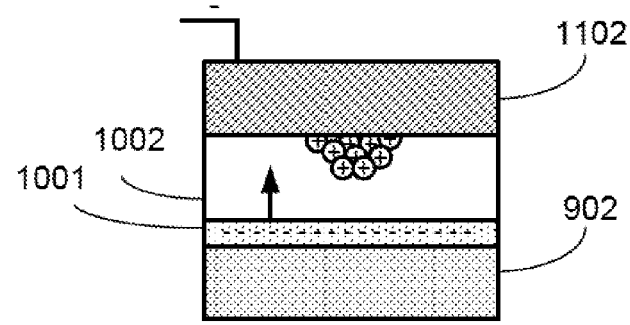

FIG. 19D illustrates an embodiment when a voltage, e.g. an erase voltage is applied across switching portion starting from the configuration illustrated in FIG. 19B. As illustrated, conductive metal particles (e.g. ions) of the conductive material 1102 migrate away from contact layer 902 upon application of a negative voltage. The negative voltage should be sufficient to overcome the attractive forces between the positive metallic ions and the negatively biased interface layer 1001. When sufficient numbers of metal ions migrate away from contact layer 902, the filament-type structure 1904 is greatly reduced, as shown. In various embodiments, when a voltage (e.g. a read voltage greater than the erase voltage, but less than the forming voltage) is subsequently applied across the switching portion, the conduction of current through switching material 1002 is greatly reduced, i.e. the resistance is increased.

In a specific embodiment, the top wiring structure, the bottom wiring structure and the switching element sandwiched between the first wiring structure and the second wiring structure provide for a switching device for a non-volatile memory device. Of course one skilled in the art would recognize other variations, modifications, and alternatives. It is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method for forming a resistive memory device comprising:
   disposing a first metallic layer above a semiconductor substrate;
   disposing a non-metallic conductive layer above the first metallic layer;
   forming an interface region above and adjacent to the non-metallic conductive layer having a negative ionic charge;
   disposing a switching media above and adjacent to the interface region, where the switching media includes an upper surface and a lower surface; and
   disposing a second metallic layer comprising a source of positive metallic ions above the switching media.

2. The method of claim 1 wherein the interface region is approximately 100 Angstroms thick or less.

3. The method of claim 1 wherein disposing the non-metallic conductive layer comprises:
   disposing a layer of material selected from a group consisting of: polysilicon, silicon germanium; and
   doping the layer of material.

4. The method of claim 1 wherein forming the interface region comprises:
   disposing a semiconductor material above the non-metallic conductive layer; and
   doping the semiconductor material with a dopant selected from a group consisting of: Boron, Aluminum, Gallium, Indium.

5. The method of claim 4 wherein doping the semiconductor material comprises doping the semiconductor material with a dopant concentration ranging from approximately 10e14 to approximately 10e19.

6. The method of claim 1
   wherein disposing the non-metallic conductive layer further comprises doping the non-metallic conductive layer to a first dopant concentration;
   wherein forming the interface region further comprises doping the interface region to a second dopant concentration; and
   wherein the second dopant concentration is different from the first dopant concentration.

7. The method of claim 1
   wherein forming the interface region comprises disposing a doped amorphous silicon layer above the non-metallic conductive layer; and
   wherein disposing the switching media comprises disposing an undoped amorphous silicon layer above the interface region.

8. The method of claim 1
   wherein disposing the non-metallic conductive layer comprises disposing a layer of silicon germanium above the first metallic layer to a thickness of approximately 300 angstroms thick or less;
   wherein forming the interface region above comprises forming a layer of doped amorphous silicon above the non-metallic conductive layer to a thickness of approximately 100 angstroms thick or less; and
   wherein disposing the switching media comprise forming a layer of undoped amorphous silicon above the interface region to a thickness of approximately 200 to approximately 300 angstroms thick.

9. The method of claim 1
wherein a barrier layer is disposed between the second metallic layer and the switching media;
wherein the barrier layer comprises a material selected from a group consisting of: an oxide, carbon, silicon dioxide; and
wherein the barrier layer has a thickness with the range of approximately 20 Å to approximately 40 Å.

10. A resistive memory device formed according to a method comprising:
disposing a first metallic layer above a semiconductor substrate;
disposing a non-metallic conductive layer above the first metallic layer;
forming an interface region above and adjacent to the non-metallic conductive layer having a negative ionic charge;
disposing a switching media above and adjacent to the interface region, where the switching media includes an upper surface and a lower surface; and
disposing a second metallic layer comprising a source of positive metallic ions above the switching media.

11. The resistive memory device formed according to the method of claim 10, wherein the non-metallic conductive layer is disposed above and in contact with the first metallic layer.

12. The resistive memory device formed according to the method of claim 10, wherein the interface region is disposed between and in contact with the non-metallic conductive layer and the lower surface of the switching media.

13. The resistive memory device formed according to the method of claim 10, wherein the non-metallic conductive layer is doped with a dopant material.

14. The resistive memory device formed according to the method of claim 13, wherein a dopant concentration of the interface region is higher than a dopant concentration of the non-metallic conductive layer.

15. The resistive memory device formed according to the method of claim 10, wherein the switching media is configured to receive ion particles or ionizable particles of the first metallic layer that form a structure from the upper surface of the switching media toward the lower surface of the switching media.

16. The resistive memory device formed according to the method of claim 10, wherein forming the interface region further comprises:
forming a semiconductor material above and adjacent to the non-metallic conductive layer; and
doping the semiconductor material with a dopant to form the semiconductor material into a doped semiconductor material.

17. The resistive memory device formed according to the method of claim 10, wherein the dopant is selected from a group consisting of: Boron, Aluminum, Gallium, and Indium.

18. The resistive memory device formed according to the method of claim 10, wherein forming the interface region further comprises forming the interface region to be approximately 100 Angstroms thick, or less.

19. The resistive memory device formed according to the method of claim 10, wherein disposing the switching media above and adjacent to the interface region further comprises disposing the switching media to a thickness between approximately 200 Angstroms and approximately 300 Angstroms thick.

20. The resistive memory device formed according to the method of claim 10, wherein disposing the non-metallic conductive layer further comprises:
disposing a polysilicon layer or a silicon germanium layer above the first metallic layer; and
doping the polysilicon layer or the silicon germanium layer to form a doped polysilicon layer or a doped silicon germanium layer.

* * * * *